United States Patent
Tan

(10) Patent No.: US 6,696,869 B1
(45) Date of Patent: Feb. 24, 2004

(54) BUFFER CIRCUIT FOR A HIGH-BANDWIDTH ANALOG TO DIGITAL CONVERTER

(75) Inventor: Nianxiong Tan, Laguna Niguel, CA (US)

(73) Assignee: Globespanvirata, Inc., Red Bank, NJ (US)

( * ) Notice: Subject to any disclaimer, the term of this patent is extended or adjusted under 35 U.S.C. 154(b) by 0 days.

(21) Appl. No.: 10/213,476

(22) Filed: Aug. 6, 2002

Related U.S. Application Data

(60) Provisional application No. 60/310,690, filed on Aug. 7, 2001, provisional application No. 60/310,668, filed on Aug. 7, 2001, provisional application No. 60/310,665, filed on Aug. 7, 2001, and provisional application No. 60/310,692, filed on Aug. 7, 2001.

(51) Int. Cl.[7] .................................................. H03B 1/00
(52) U.S. Cl. ........................ 327/108; 327/310; 330/253
(58) Field of Search .......................... 327/108, 540, 327/541, 560, 561, 562, 563, 313, 310, 551, 552; 326/82, 83; 330/300, 253, 291, 310, 283, 277; 341/118

(56) References Cited

U.S. PATENT DOCUMENTS

| | | | | |
|---|---|---|---|---|
| 5,239,210 A | * | 8/1993 | Scott | 327/63 |
| 5,856,757 A | * | 1/1999 | Eschauzier | 327/553 |
| 6,005,439 A | * | 12/1999 | Fong | 330/253 |
| 6,408,010 B1 | * | 6/2002 | Stroet | 370/503 |
| 6,454,781 B1 | * | 9/2002 | Witt et al. | 606/169 |

* cited by examiner

Primary Examiner—Linh M. Nguyen
(74) Attorney, Agent, or Firm—Thomas, Kayden, Horstemeyer & Risley

(57) ABSTRACT

The present invention relates to improved ADC buffers and AFEs for high frequency applications, such as VDSL. The present invention can also be programmably configured for other xDSL applications. In this regard, a buffer circuit for a high-bandwidth analog-to-digital converter (ADC) includes a first unity-gain buffer configured to receive an analog input signal. The first unity-gain buffer includes a MOSFET differential amplifier with a current mirror load and a transient-reduction network electrically interconnected with the MOSFET differential amplifier and configured to reduce transient energy emitted by the ADC. The buffer circuit also includes a second unity-gain buffer cascaded to the first unity-gain buffer and configured to provide the analog input signal from the first unity-gain buffer to the ADC.

15 Claims, 5 Drawing Sheets

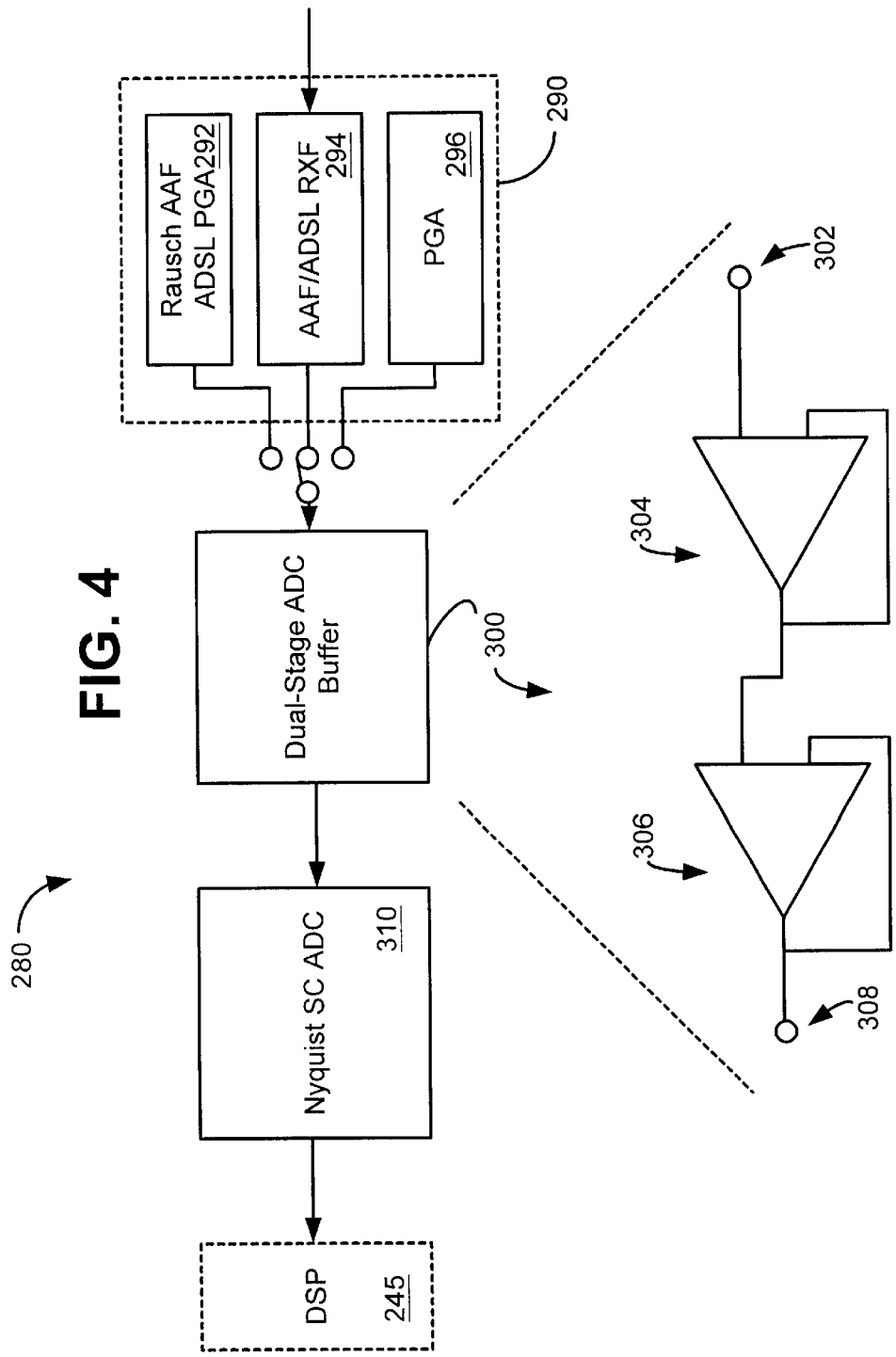

BUFFER CIRCUIT FOR A HIGH-BANDWIDTH ANALOG TO DIGITAL CONVERTER

CROSS-REFERENCE TO RELATED APPLICATION

This application claims priority to the following co-pending U.S. provisional patents: a) U.S. Provisional Patent Application Ser. No. 60/310,690 filed on Aug. 7, 2001, and entitled "Quad AFE for DSL CO Applications," b) U.S. Provisional Patent Application Ser. No. 60/310,668, filed Aug. 7, 2001, and entitled "High-pass Receive Filter for VDSL," c) U.S. Provisional Patent Application Ser. No. 60/310,665, filed on Aug. 7, 2001 and entitled "ADC Buffer for High-bandwidth ADCs," and d) U.S. Provisional Patent Application Ser. No. 60/310,692, filed Aug. 7, 2001 and entitled "Automatic Tuning Technique for Analog Filters," which are all hereby incorporated by reference in their entirety.

This application is also related to the following co-pending U.S. utility patent applications: a) "Wide-Band Analog Front-End For DSL Applications," having Ser. No. (unknown), filed Aug. 6, 2002, with U.S. Express Mail Package No. EL924321582US; b) "Improved Active Filter and Method," having Ser. No. (unknown), filed Aug. 6, 2002, with U.S. Express Mail Package No. EL924321619US; and c) "System And Method For Tuning An RC Continuous-Time Filter," having Ser. No. (unknown), filed Aug. 6, 2002, with U.S. Express Mail Package No. EL924321596US; which are all incorporated by reference herein in their entirety.

FIELD OF THE INVENTION

The present invention generally relates to xDSL communications. More specifically, the invention relates to analog front ends (AFES) for VDSL communication.

BACKGROUND OF THE INVENTION

With the advancement of technology, and the need for instantaneous information, the ability to transfer digital information from one location to another, such as from a central office to customer premises, has become more and more important.

In a digital subscriber line (DSL) system, data is transmitted from a central office to customer premises via a transmission line, such as a two-wire pair, and is transmitted from the customer premise to the central office as well, either simultaneously or in different communication sessions. The same transmission line might be utilized for data transfer by both sites or the transmission to and from the central office might occur on two separate lines. In its most general configuration, a DSL card at a central office is comprised of a digital signal processor (DSP) which receives information from a data source and sends information to an analog front-end (AFE). The AFE serves as the interface between an analog line, such as the two-wire pair, and the DSP. The AFE functions to convert digital data, from the DSP, into a continuous-time analog signal when processing downstream data. Conversely, the AFE serves to convert an analog signal to digital data when processing upstream data.

As an important part of the aforementioned system responsible for proper transmission and reception of data in a broadband network, the AFE performs multiple functions in addition to converting a digital signal into a continuous time analog signal, and vice versa. However, the functionality of the AFE is particular to the specific DSL application considered, wherein factors such as signal bandwidth, data rate, data reach, signal quality, power budget, and different applicable standards determine the optimum AFE. In order to minimize application specific implementations of digital-to-analog converters (DACs) and analog-to-digital converters (ADCs) across the many DSL applications, it is desired to create high-performance configurable DACs and ADCs.

Asynchronous DSL (ADSL) is a popular service provided for residential customers, due to the asymmetrical nature of data usage, wherein more data flows towards the customer in the downstream direction, in comparison to the upstream data flow. The larger downstream data flow is generally attributed to accessing Internet Web sites. When a Web site is accessed, a relatively large amount of data related to the Web page is transmitted downstream to a browser located in a customer's PC. The bulk of the upstream data is generally attributable to e-mail traffic directed towards other Internet users, and this constitutes a smaller data volume than the one traveling downstream.

Very High bit-rate DSL (VDSL) is similar to ADSL but provides large amounts of bandwidth with speeds up to about 52 Mbps. In order to provide such high speeds, a large bandwidth, as mentioned, is required. Typically, the VDSL frequency band ranges from 300 kHz to up to about 12 MHz. Unfortunately, the trade-off with high frequencies is the distance the signals can travel along a copper line. The development of Fiber to the Curb (FTTC) and/or Fiber to the Neighborhood (FTTN) provides for the use of VDSL by, essentially, reducing the length of the copper loop. Fiber cables, which can support high bandwidths over long distances, are provided from the CO to Optical Network Units (ONUs) located either at the curb of residences or the gateway to a neighborhood. The ONUs can convert the optical signals into electrical signals downstream and vice-versa upstream. With the use of FTTN and or FTTC, the effective copper loop is reduce to below 4000 ft, which is the upper limit of VDSL. VDSL, for example, provides for the transmission of video signals over copper lines, which leads to applications such as digital television, Video-on-Demand, etc.

Traditional AFEs for ADSL cannot be utilized for VDSL applications because of the bandwidth issues and the high frequencies involved. In particular, the ADC located in the upstream signal path of a CO AFE is affected by the high-frequency signal. Improvements of the ADC for high-frequency applications includes pipeline structures. The oversampling ADC is usually not suitable for VDSL because of the bandwidth requirements. VDSL requires about 10 times the bandwidth of ADSL. For example, for a typical ADC for ADSL the oversampling ratio is usually 32, which equates to a clock frequency of about 71 MHz. If this same structure is used for VDSL, the clock frequency would be more than 700 MHz. Using an ADC pipeline structure, the clock frequency may be only 2 times the bandwidth. To help in filter designs, however, the clock frequency is typically 3 to 4 times the bandwidth. For VDSL applications this is much lower than what the oversampled approach would provide. Unfortunately, high-speed ADCs have caused a need for associated drive amplifiers or buffers to be placed at the input of the ADCs. Typically, the buffers must provide a low source impedance and sufficient instantaneous output current to drive the ADC, and its high-frequency output impedance must be sufficiently low to avoid excessive conversion error.

Switched capacitance (SC) architectures for ADCs have added drawbacks in that a large transient spike of input current is drawn at the end of each conversion, when the internal sampling capacitors switch back to the input for acquisition of the next sample. To avoid error, the buffer circuitry must recover from this transient and settle before the next conversion starts. This helps avoid the "kick-back" affect caused by the transient on the preceeding continuous-time blocks in the receive path of the AFE.

One prior-art solution to the problem caused by SC ADCs is to utilize a standard unity-gain buffer and add an RC filter prior to the buffer stage. The capacitor of the RC filter would typically be much larger than the ADC's input capacitance, which helps to eliminate the transient by providing charge for the sampling capacitor. Unfortunately, RC filtering is only effective when oversampled ADCs are utilized and where the signal bandwidth is much smaller than the clock frequency. Without oversampling, a single-pole filtering is not effective especially considering the large cut-off frequency variation of the RC filter.

Another problem with this general configuration is the input nonlinear parisitic capacitance of the buffer. If the driving impedance is high, distortion tends to be the result. Using an RC filter increases the impedance seen by the ADC buffer input unless the resistance of the RC filter is small. If the resistance is small, the capacitance that creates the pole of the RC filter will load the continuous-time blocks, which can significantly degrade performance and cause instability.

Therefore, there exists a need for improved ADC buffers and AFEs for high frequency applications, such as VDSL. It would also be desirable for this solution to be readily configured for other applications, such as other xDSL applications.

SUMMARY OF THE INVENTION

The present invention relates to improved ADC buffers and AFEs for high-frequency applications, such as VDSL. The present invention can also be programmably configured for other xDSL applications. In this regard, a buffer circuit for a high-bandwidth analog-to-digital converter (ADC) includes a first unity-gain buffer configured to receive an analog input signal. The first unity-gain buffer includes a MOSFET differential amplifier with a current mirror load and a transient-reduction network electrically interconnected with the MOSFET differential amplifier and configured to reduce transient energy emitted by the ADC. The buffer circuit also includes a second unity-gain buffer cascaded to the first unity-gain buffer and configured to provide the analog input signal from the first unity-gain buffer to the ADC.

In another embodiment, the invention may be construed to be an AFE for a communication system. The AFE comprising, in its receive path at least a first continuous-time processing element, a dual-stage ADC buffer coupled to the at least first continuous-time processing element, and a Nyquist switched-capacitance (SC) ADC coupled to the ADC buffer.

Other systems, methods, features, and/or advantages of the present invention will become more apparent to one with skill in the art upon examination of the following drawings and detailed description. It is intended that all such additional systems, methods, features, and/or advantages be included within this description, be within the scope of the present invention, and be protected by the accompanying claims.

BRIEF DESCRIPTION OF THE DRAWINGS

The present invention will be more fully understood from the detailed description given below and from the accompanying drawings of the preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

FIG. 4 is a block diagram illustrating the receive path of an AFE in accordance with embodiments of the present invention.

FIG. 5 is a circuit schematic illustrating an embodiment of a dual-stage buffer for an ADC in accordance with the present invention.

DETAILED DESCRIPTION

Figure 1:
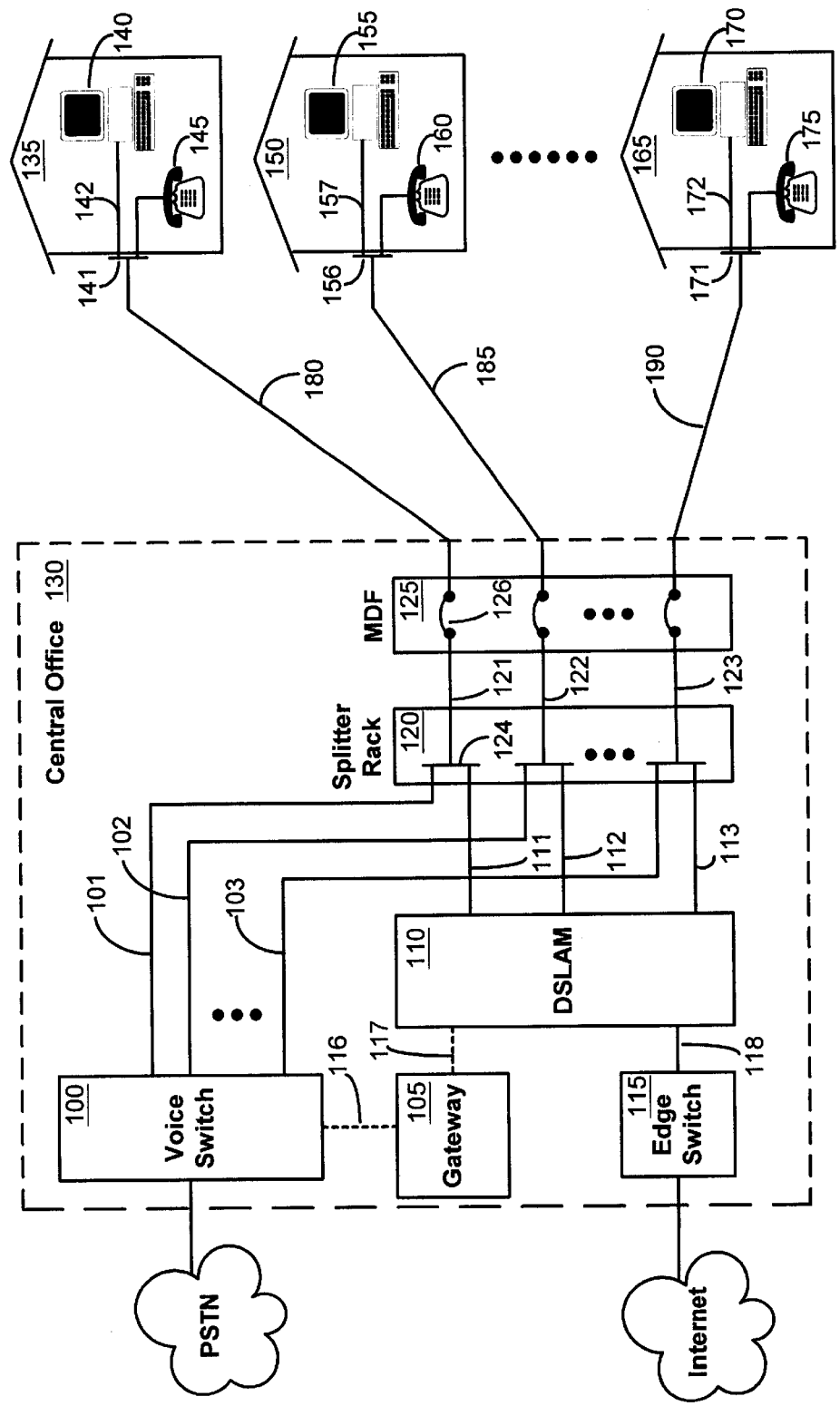
FIG. 1 is an illustration of a typical central office providing full-rate xDSL service to multiple residential customers.

Turning now to the drawings illustrating the present invention, wherein like reference numerals designate corresponding parts throughout the drawings, FIG. 1 is an illustration of a typical central office 130 providing full-rate xDSL service to multiple residential customers.

To define some commonly used terms in telecommunication applications, data flowing in the general direction from residences 135, 150, 165 towards the central office (CO) 130 is typically referred to as "upstream" data, while data flowing in the opposite direction, from CO 130 towards residences 135, 150, 165, is termed "downstream" data. Also, the communication links that exist between one CO 130 and another in the public switched telephone network (PSTN), are generally referred to as "trunks," while the communication links between the CO 130 and residences 135, 150, 165 are referred to as "lines" 180, 185, and 190.

While the explanation in this disclosure may often refer to only one direction of data flow for ease of explanation, it will be understood that the data flow within the various elements shown in FIG. 1, is generally bi-directional in nature, and the circuits and methods explained in this disclosure may be implemented in either direction.

The DSL access multiplexer (DSLAM) 110, shown located inside the CO 130, is a major component of any system that is designed to provide DSL service, such as Asymmetric DSL (ADSL) or VDSL to multiple customers from a centralized location. On the trunk side of the DSLAM, a high speed data link 118 is shown connecting it to an edge switch 115. Data link 118 may, for example, carry data packets contained inside an asynchronous transfer mode (ATM) transport mechanism, or Ethernet package. These data packets are suitably routed by the edge switch 115, and are transported from and into the Internet, as shown in FIG. 1.

An alternative trunk side high-speed data link 117, shown as a dotted connection in FIG. 1, may be provided in certain applications, wherein the DSLAM 110 transmits data packets contained within a suitable transport mechanism, such as an OC-3 link, into the gateway 105. The gateway translates the packet format into a time division multiplex (TDM)

format which can be processed by the voice switch 100 before transmission into the PSTN.

On the line side of DSLAM 110, communication links 111, 112 and 113 are three of "n" communication links that connect the DSLAM 110 into the splitter rack 120. While FIG. 1 depicts the splitter rack 120 as existing external to DSLAM 110, several system configurations physically incorporate the splitter functionality within the DSLAM 110. The links 111, 112 and 113 carry the downstream and upstream DSL data.

Communication links 101, 102 and 103 are three of "n" communication links that connect the voice switch 100 to the splitter rack 120. Links 101, 102 and 103 carry analog voice frequency signals bi-directionally. Splitter 124 is one of several splitters contained in the splitter rack 120.

Splitter 124, used here for explanation purposes in a full-rate ADSL or VDSL application, combines the downstream DSL signal that is transmitted by the DSLAM 110 via link 111, with the analog voice frequency (VF) signal carried from voice switch 100 over link 101, before transmitting it to the main distribution frame (MDF) 125, via link 121. Splitter 124 is so named, because it "splits" the DSL signal from the analog VF signal, in the opposite (upstream) direction.

The MDF 125, is a centralized CO wiring interface, where all the wires entering and exiting a CO are interconnected. For example, link 121, which may consist of an unshielded twisted pair (UTP) of wires used inside the CO building, is interconnected by jumper 126, to the external twisted-wire pair 180 which is generally designed to be enclosed inside a shielded cable assembly.

The downstream DSL signal together with the downstream analog VF signal that is present at jumper 126 is connected by data link 180, which is generally a residential POTS line, to the residence 135. Splitter 141 is located on the outside wall of residence 135, and splits the signal transmitted from the interconnection 126, into an analog VF signal and a downstream DSL signal.

The analog VF signal may be routed to a telephone 145, as shown in FIG. 1, while the downstream DSL signal is connected to a PC 140, via communication link 142. The DSL signal entering PC 140 is generally routed to an DSL modem that may be installed inside the PC 140 or may be installed as an external modem that is cabled into the PC is 140.

Figure 2:
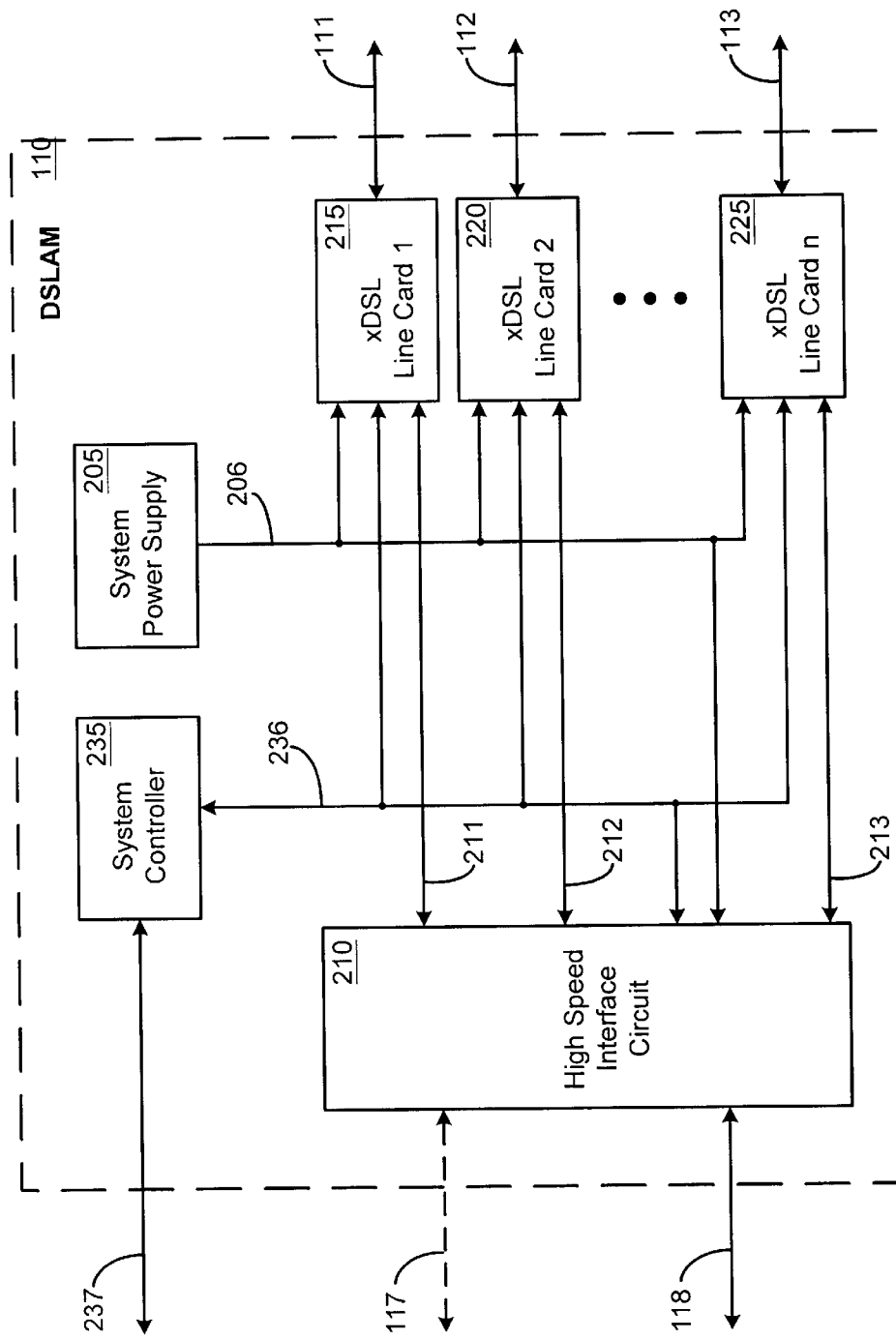
FIG. 2 is a block diagram representation of the main functional blocks inside a typical DSLAM.

FIG. 2 is a block diagram representation of the main functional blocks inside a typical DSLAM 110. The various blocks shown in FIG. 2, generally represent circuit packs that are plugged into a DSLAM chassis. The circuit pack architecture permits easy insertion and/or removal, thereby permitting a certain degree of flexibility in configuring the DSLAM 110 to provide various types of DSL service. It also allows relatively easy replacement of defective circuit packs, a replacement that may be carried out while the DSLAM 110 is in operation without generally affecting the multiple customers that are being provided DSL service.

The high-speed data link 118, as well as the optional high speed data link 117, which were referred to earlier in FIG. 1, are the trunk-side connections of the high-speed interface circuit 210. Data link 118, may carry data packets over various transport protocols, such as ATM and TCP/IP. On the line side of the interface circuit 210, low-speed data links such as links 211, 212 and 213 connect the high speed interface circuit 210 to multiple line cards. The line cards shown in FIG. 2 may be composed of several different types of cards to cater to a mix of xDSL services, such as the previously discussed ADSL, as well as Symmetric DSL (SDSL), High bit-rate DSL (HDSL), Single-pair HDSL (SHDSL), Very High bit-rate DSL (VDSL), etc.

Business users may prefer a more symmetric data flow that ADSL, and SDSL may be more suitable for such purposes. Correspondingly, a typical DSLAM may include a number of ADSL line cards together with SDSL, HDSL, and/or VDSL line cards.

FIG. 2 depicts "n" number of xDSL line cards serving a number of residential customers. xDSL line card 1 215 provides xDSL service to residential customer 135, while xDSL line card 2 220 provides xDSL service to residential customer 150, and xDSL line card n 225 provides xDSL service to residential customer 165.

System controller 235 is used for operations, administration, maintenance and provisioning (OAM&P) purposes. Provisioning the DSLAM 110 may include such procedures as would be necessary to provide various different types of DSL service via different types of line cards. Maintenance may include inventory procedures as well as defect reporting. System controller 235 generally communicates to elements that are external to DSLAM 110, via a communication interface that is not shown in FIG. 2.

System power supply 205 provides power, typically in the form of several DC voltages that may be required to operate the circuit packs in the DSLAM 110. These voltages may include for example, +3.3 volts to operate the various digital ICs, and +/−15 volts to operate the line interfaces. System power supply 205 is typically powered by an external power source, such as a $^-48$ volt battery bank, via a power-line connection that is not illustrated in FIG. 2.

Figure 3:
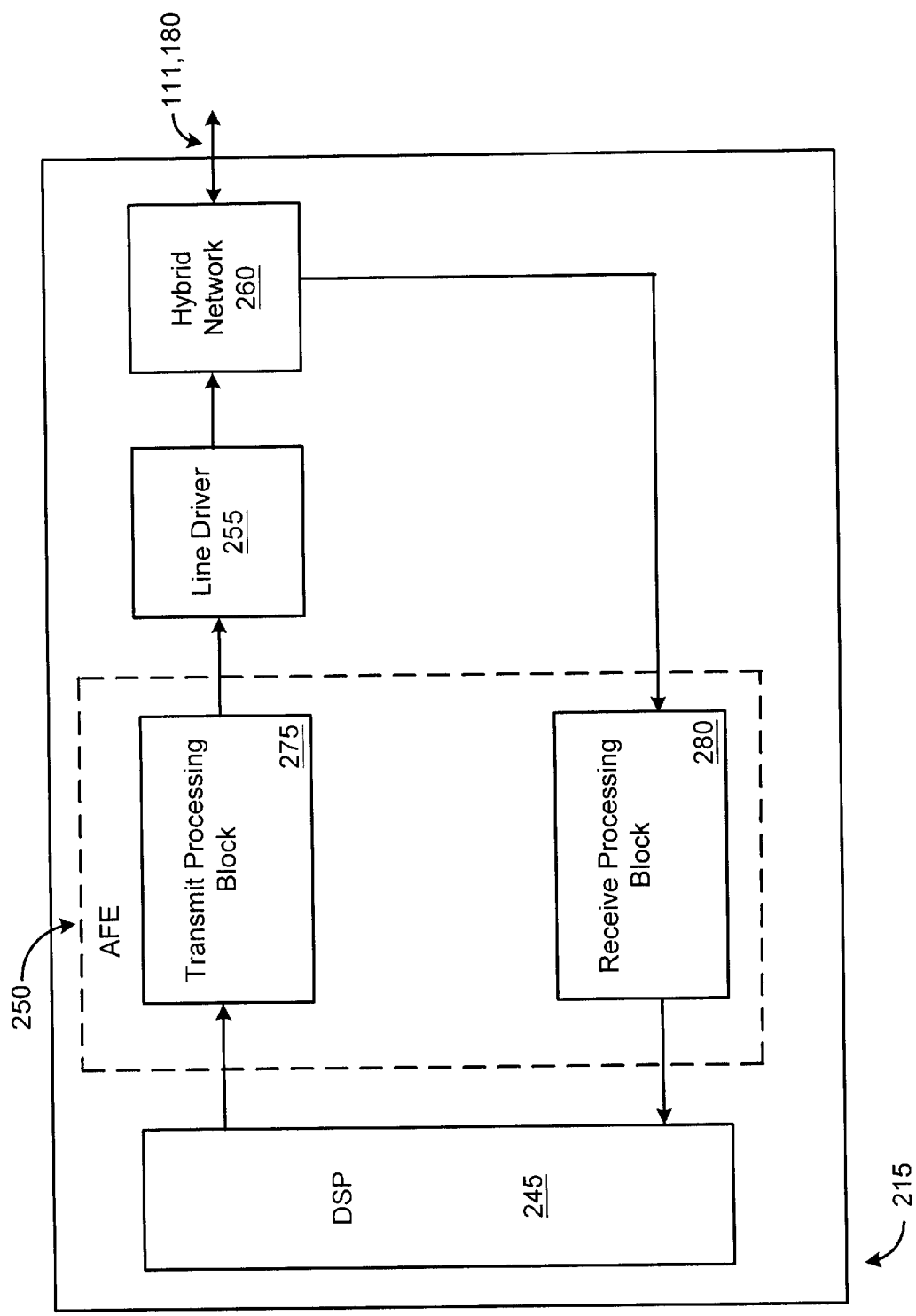
FIG. 3 is a block diagram further illustrating the xDSL central office interface card of FIG. 2.

FIG. 3 is a block diagram further illustrating the CO xDSL interface card 215 of FIG. 2. As shown by FIG. 3, with regard to the present illustration, transmission of data may be directed from the CP 135 to the CO 130, from the CO 130 to the CP 135, or in both directions at the same time via line 180. The xDSL interface card 215 located at the CO 130 may comprise a CO digital signal processor (DSP) 245, which receives information from a data source (not shown) and sends information to a CO AFE 250. The CO AFE 250 may interface between the local loop 180, via link 111, and the CO DSP 245 and functions to convert digital data, from the CO DSP 245, into a continuous time analog signal.

The analog signal is delivered, via a CO line driver 255, in accordance with the amount of power required to drive the amplified analog signal through a hybrid network 260, the local loop 180, and then on to the CP 135. An xDSL interface card similar to interface card 215 may be found at the CP 135 and perform the reciprocal operations as the xDSL interface card 215.

In the receive path, an upstream analog signal may be received by hybrid network 260. The hybrid network 260 may then de-couple the received signal from the transmitted signal, by subtracting the transmitted signal from the sum of the transmitted and received signals. The AFE 250 may then convert the received analog signal into a digital signal, which may then be transmitted to the DSP 245 for further digital processing.

The AFE 250 generally serves to convert a digital signal to analog in the transmit path and convert an analog signal to digital in the receive path. For simplicity, the transmit path of the AFE 250 shall be termed a transmit processing block 270. In general terms, the transmit processing block 270 may include DAC (not shown), which performs the conversion. Several filter stages and/or gain stages may also be included within the transmit processing block 270 to attenuate out-of-band noise and/or amplify the in-band signal. Typically, noise may be produced in the transmit signal from processing by the DSP 245 as well as the DAC. In some AFEs, digital filters may be included with the AFE 250 to filter the digital transmit signal prior to conversion. The transmit processing block 270 may include several stages and/or several different implementations depending upon the attenuation requirements, power requirements, etc. Likewise, the transmit processing block 270 may be configured in such a way for a specific DSL application. For example, for ADSL applications, the transmit (downstream) frequency band is typically between 138 kHz to 1.1 MHz, which may call for a high-pass filter with a cut-off frequency around 138 kHz. In SDSL applications, the downstream frequency band is typically around 567 kHz to 1.1 MHz, which may call for a high-pass filter with a different cut-off frequency. For HDSL or SHDSL applications, no filter may be utilized due to the overlapping of the transmit and receive bandwidth. Other applications, such as VDSL may utilize different types of analog filters or may configure similar filters differently for different applications. Once the transmit signal is filtered, it may be provided to the line driver 255 for further processing towards transmission.

In the receive path, the AFE 250 may perform similar functions. The received analog signal may be processed by several analog filters and/or gain stages. The receive processing block 280 may be configured to attenuate out-of-band noise, whereas several gain stages may be configured to amplify the in-band signal. Once filtered, the analog signal may be provided to an ADC for conversion to digital. The digital receive signal may be further processed by digital filters (not shown) if applicable. The digital signal may be passed along to the DSP 245 for further processing. The receive processing block 280 will be discussed in more detail in subsequent figures.

FIG. 4 is a block diagram illustrating the receive processing block 280 of the AFE 250 of FIG. 3. Of interest in this particular application is an ADC buffer 300. Therefore, other components (i.e. a hybrid amplifier and a receive filter (RXF) not directly related to the ADC buffer 300 have been excluded from the illustrated figure although briefly described below.

A hybrid amplifier (not shown), a VDSL receive filter (RXF) (not shown), PGA 296, AAF/ADSL RXF 294, Rausch AAF ADSL PGA 292, ADC buffer 300, and ADC 310 are elements that may be included in the receive processing block 280 inside AFE 250. An analog signal that is received via circuitry connected to a DSL line, is fed into a hybrid amplifier and appears as a digital signal at the output of ADC 310 after having traversed a receive signal path. The digital signal may then be provided to the DSP 245 which is external to the AFE 250.

The hybrid amplifier is a first-stage programmable gain amplifier with a wideband frequency response that is independent of the gain setting. It has a typical operating voltage gain range of −6 dB to +24 dB. Its input impedance is selectable between 50 ohms and 600 ohms thereby allowing it to be interfaced into external circuitry of correspondingly matched output impedances. The input signals to the hybrid amplifier may be derived from one of three different sources—an external hybrid circuit, an external receiver circuit, or an internal test multiplexer circuit contained inside AFE 250.

The VDSL receive filter (RXF) may be a high-pass filter and is typically a third-order elliptic filter that is used to eliminate unwanted high frequencies. Removing these unwanted frequencies is desirable in minimizing the design specification requirements of ADC 310, and improving the accuracy of the analog-to-digital conversion. Typical cut-off frequencies are 3, 3.75, and 4 MHz. The RXF may be programmably by-passed if it is not needed for any particular application.

A programmable gain amplifier (PGA) 296 may provide programmable gain up to 23 dB, with a typical step resolution of 1 dB. The input signals to PGA 296 may be derived from one of three different sources—the hybrid amplifier, the RXF, or another passive filter (not shown), that may located outside AFE 250. AAF/ADSL RXF 294 is a dual purpose filter that can be either used as an anti-aliasing filter, or as a receive signal filter for ADSL. When used as an anti-aliasing filter, AAF/ADSL RXF 294 prevents noise-aliasing at the input stage of the ADC 310. Typically, a third-order elliptic filter with variable cut-off frequency, e.g. 5.2 MHz, is used to implement this circuit. This filtering is desirable as the ADC 310 uses a Nyquist approach rather than an over-sampling technique.

When used as a receive signal filter in an ADSL application, AAF/ADSL RXF 294 has a selectable cut-off frequency of either 138 kHz or 276 kHz. AAF ADSL RXF 294 may be selectively by-passed when not needed for a particular application.

Rausch AAF ADSL PGA 292 incorporates a filter circuit that can be used as an anti-aliasing filter for VDSL signals. Rausch AAF ADSL PGA 292 can also be used to provide programmable gain to a signal that has been transmitted through AAF ADSL RXF 294 configured as a receive filter circuit. The filter cut-off frequency may be set at a typical value of 5.2 MHz for VDSL, and at either of two frequencies, 138 kHz or 276 kHz, for ADSL signals. The gain can be programmed up to 10 dB in steps of 1.5 dB. Rausch AAF ADSL PGA 292 may be selectively by-passed where not required.

ADC buffer 300 is a wide-band buffer circuit that drives ADC 310. It may be selected to accept one of three signals from three different sources—PGA 296, AAF/ADSL RXF 294, or Rausch AAF ADSL PGA 292. It is programmable for different bandwidths depending on specific applications. The ADC buffer 300 is a dual-stage buffer and will be discussed in more detail in subsequent figures.

ADC 310 is a pipeline analog-to-digital switched-capacitance converter with a maximum resolution of 14 bits. Typically, only 12-bit resolution is used in several DSL applications. ADC 310 accommodates wide-band signal inputs such as VDSL, and avoids the use of over-sampling techniques that require high clock rates with their attendant issues of implementation and operation such as cross-talk and electromagnetic interference (EMI).

Having briefly described the receive processing block 280 of the AFE 250, attention is now directed toward FIG. 5, which is a circuit schematic illustrating an embodiment of the dual-stage buffer 300 for an ADC in accordance with the present invention. The dual-stage buffer 300 receives at its input 302 the receive analog signal from previous stages in the receive processing block 280 (See FIG. 4). The dual-stage buffer 300 is comprised of two unity gain buffers, a first-stage 304 and a second-stage 306. The dual stage buffer 300 provides the analog buffered signal via its output 308 to the ADC 310.

In the preferred embodiment, the input 302 of the buffer 300 may be a switched input, capable of receiving a signal from one of multiple sources. In this embodiment, as illustrated in FIG. 4, the three sources may be the PGA 296, AAF/ADSL RXF 294, Rausch AAF ADSL PGA 292. Selection of the source may be made in accordance with the desired application: VDSL, ADSL, etc. The input 302 may be configured to be switched in a number of ways. Seemingly, the most practical, and the preferred method, is to provide a programmable input, with a controlling device (not shown) dictating which input to receive from. A simple 2-bit programmable input may be used as there are currently three possible sources from which to select.

As mentioned earlier, the fundamental purpose, of the dual-stage buffer 300 is to isolate the continuous-time blocks 290 from the ADC 310 so as to reduce the transient signals that may be generated by the ADC 310 and subsequently "kicked back" to the continuous-time blocks 290. Each stage of the buffer 300 provides for a level of isolation as any transient signals are attenuated in each stage. The second-stage buffer 306 first receives any transient signal at its output 308. The second-stage buffer 306 attenuates the transient signal to a certain level. Due to parasitic capacitance inherent to amplifiers, the transient signal is fed back through the second-stage buffer 306 to its input, albeit attenuated. The first-stage buffer 304 may then receive the attenuated signal transient signal at its output and attenuate the transient to another level. Again, due to parasitic capacitance inherent to amplifiers, the transient signal is fed back through the first-stage buffer 304, but highly attenuated. The first-stage buffer 304, as will be discussed in FIG. 6, includes added circuitry that can greatly reduce any transient signal from passing through to its input. The continuous-time blocks 290 may receive the transient signal but may be largely unaffected because of the two-levels of attenuation provided by the dual-stage buffer 300.

The dual-stage buffer 300 would appear intuitive at first sight, as it provides for two levels of attenuation of any transient signal. There are several other factors to consider however. Power consumption is constantly an important issue in communication systems, as it encompasses a large portion of the overhead operating costs. There is constantly a trade-off between power consumption and performance. The dual-stage buffer 300 of the present invention provides for two-levels of buffering while still maintaining relatively low-power. Because of the cascaded nature of the buffer 300, the first-stage 304 need only drive the second-stage 306, which subsequently drives the ADC 310. So, the first-stage 304 can utilize a low-power amplifier. Furthermore, the first-stage buffer 304 may have a reduced bandwidth as compared to the second-stage buffer 306, which helps to reduce the power consumption of the buffer 300.

Bandwidth is another concern, particularly in this invention, because of the high-frequency applications, such as VDSL. For VDSL applications, the bandwidth required is upwards of 12 MHz. For ADSL applications, the bandwidth required is only 138 kHz (Annex A) or about 276 kHz (Annex C) for the CO. In the preferred embodiment, the dual-stage buffer 300, and in particular the allowed bandwidth of the buffer 300, may be configured to be adjusted in accordance with the particular application, namely VDSL or ADSL. Furthermore, the buffer 300 may be adjusted to compensate for temperature variations during operation as well as process variations that may occur in the manufacture of the components. In the preferred embodiment, the adjusting of the bandwidth of the dual-stage buffer 300 may be done by the same general controlling element (not shown) as that which controls the switching of the particular continuous-time blocks 290. A digital programmable control may be utilized to adjust the bandwidth of the buffer 300. In one embodiment, the DSP 245 (See FIG. 4) may be configured to provide the control element.

It should be noted, that although VDSL and ADSL have been mentioned as applications in which the preferred embodiment has been configured for, certainly other applications such as SDSL and SHDSL could be provided for with embodiments of the present invention. Furthermore, this invention should not be limited to only those applications that have been expressly mentioned herein.

While in some instances it may be preferred to have overly-sufficient bandwidth for a particular application, quite often it is not, especially considering the power consumption that is directly related to bandwidth. So, the dual-stage buffer 300 of the present invention is capable of being adjusted to provide for a sufficient, but generally not overly-sufficient bandwidth for a particular application, which helps in controlling power consumption. Another side-effect results with increased bandwidth: increased noise bandwidth. As a signal bandwidth increases, so too does its accompanying noise bandwidth, in line with the signal-to-noise ratio (SNR) of the system. Therefore, the noise penalty is another reason to not have overly-sufficient bandwidth.

In the preferred embodiment, the bandwidths of the two-stages differ. The first-stage buffer 304 has a reduced bandwidth which helps reduce the overall noise bandwidth as well as the power consumption. The second-stage buffer 306 must have a sufficient bandwidth to provide for significant open-loop gain for all frequencies of interest. The necessary open-loop gain is a function of the size of the transient signal received at the output; the greater the transient signal, the greater the open-loop gain should be. The first-stage buffer 304, however, need not the same open-loop gain, as the transient signal has been reduced to a particular level by the second-stage buffer 304. Therefore, the first-stage buffer 304 can be configured for a reduced open-loop gain, and subsequently less necessary bandwidth to provide for the open-loop gain.

In the preferred embodiment, the first-stage and second-stage buffers 304 and 306 have been configured for preferred bandwidths. For example, for VDSL applications, the first-stage buffer 304 may be configured for a 100 MHz bandwidth, whereas the second-stage buffer 306 may be configured for a 200 MHz bandwidth. For ADSL applications, the first-stage buffer 304 may be configured for a 40 MHz bandwidth, whereas the second-stage buffer 306 may be configured for a 60 MHz bandwidth. These are simply exemplary and preferred configurations, and in reality, the actual bandwidths could vary significantly. What is important, however, is the relative values from one stage to the other and for different applications. The method in which the buffer 300 may be configured will be discussed in further detail with relation to FIG. 6.

Figure 6:
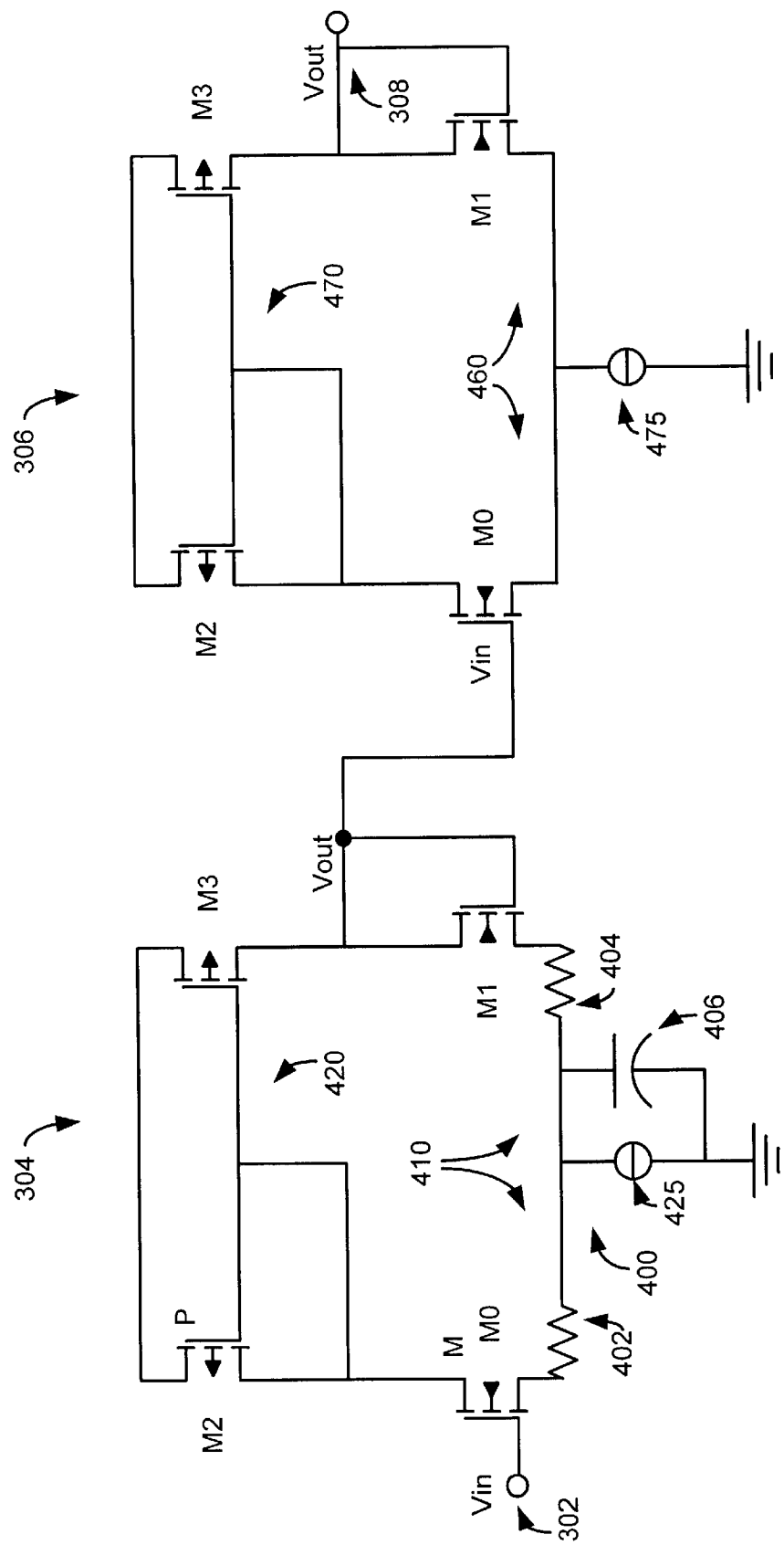
FIG. 6 is a detailed circuit schematic further illustrating the dual-stage buffer of FIG. 5.

FIG. 6 is a detailed circuit schematic further illustrating the dual-stage buffer 300 of FIG. 5. The dual-stage buffer 300 includes a first-stage buffer 304 cascaded with a second-stage buffer 306. As discussed in FIG. 5, the dual-stage buffer 300 includes an input 302 and an output 308. The input may be a switched input coupled with various continuous-time blocks 290 as discussed in FIG. 4. The output 308 may be coupled to the ADC 310.

The first-stage buffer 304 may be comprised of a differential MOSFET amplifier 410 that includes two n-channel MOSFETS M0 and M1. The gate of each MOSFET M0 and M1 may be coupled to an input of the first-stage-buffer 304. The drain of each MOSFET of the differential amplifier 410 may be coupled to a current mirror 420 which is comprised of two p-channel MOSFETS M2 and M3. The output of the first-stage buffer 304 is coupled to the gate of the M1

MOSFET of the differential amplifier 410, thus providing a feedback loop for the first-stage buffer 304. A tail current source 425 is provided to the source of each MOSFET of the differential amplifier 410 through a transient-reduction network 400. The transient-reduction network 400 is comprised of two source degenerative resistors 402 and 404 and a shunt capacitor 406.

The second-stage buffer 306 is similar to the first-stage buffer 304 in that a MOSFET differential amplifier 460 is coupled to a MOSFET current mirror 470. The differential amplifier 460 includes two n-channel MOSFETS M0 and M1. The current mirror 470 includes two p-channel MOSFETS M2 and M3. The gate of each MOSFET of the differential amplifier 460 receives an input, the first input being the output of the first-stage buffer 304, the second input being the feedback path of the output of the second-stage buffer 306. Again, a tail current source 475 is coupled to a common source of the differential amplifier 460.

For a clear understanding, the upstream receive signal is passed from the input 302 of the dual-stage buffer 300 to the output 308. The receive signal first travels through the first-stage buffer 304 and then on to the second-stage buffer 306. Conversely, a transient signal generated by the ADC 310, which may originate at the output 308, may be coupled back through the second-stage buffer 306 to the first-stage buffer 304 onto the input 302 of the dual-stage buffer 300. As mentioned in FIG. 5, each stage of the dual-stage buffer 300 provides for attenuation of the transient signal.

As mentioned, the first-stage buffer 304 includes a transient-reduction network 400 that is configured to further reduce or attenuate a transient signal that is received at the output of the first-stage buffer 304. The transient-reduction network 400 may include two resistors 402 and 404 which separate the common sources of the differential is amplifier 410. The transient-reduction network 400 may further include a de-coupling capacitor 406 which helps to further reduce any transient energy that is provided at the output of the first-stage buffer 304. The transient-reduction network 400 is not truly in the signal path and so it does not have much impact on the receive signal except for the reduction of the transconductance, which results in a smaller bandwidth and slightly higher noise. The transient-reduction network 400 is included in the first-stage buffer 304 and not the second-stage buffer 306 because of the necessary bandwidth of the second-stage buffer 306 to drive the switch capacitance load, i.e., the ADC 310. In essence, the transient-reduction network 400 provides for further transient filtering for the dual-stage buffer 300.

The tail current sources 425 and 475 of the respective buffer stages 304 and 306 provide for programmable bias current to differential amplifiers 410 and 460. The current sources 425 and 475 may be programmed to control the bandwidth of each of the stages 304 and 306. For example, for VDSL applications the first-stage current source 425 may be programmed to provide a 200 mA current which may provide for the 100 MHz bandwidth as mentioned in FIG. 5. Whereas, the second-stage buffer 306 current source 475 may be programmed to provide an 800 mA current which provides for a 200 MHz bandwidth. For ADSL applications, the programmable bias may be changed for each stage so as to provide for, for example, a 50 mA current for the first-stage 304 which results in a 40 MHz bandwidth. Whereas, for the second-stage buffer 306 a 200 mA current may be provided which allows for a 60 MHz bandwidth. As mentioned, VDSL and ADSL are just exemplary applications that may be programmed for the dual-stage buffer 300. In reality, the tail currents 425 and 475 may vary greatly.

Significant ranges for the first-stage buffer's programmable current 425 may be in the range of 50–400 mA, whereas the second-stage buffer's programmable current 475 may be 200–1600 mA. The circuits have been designed to allow for extra current headroom, to compensate for variations in temperature and variations in the components upon manufacture.

It should be emphasized that the above-described embodiments of the present invention, particularly, any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

What is claimed is:

1. A buffer circuit for a high-bandwidth analog-to-digital converter (ADC), the buffer circuit comprising:

a first unity-gain buffer configured to receive an analog input signal, the first unity-gain buffer comprising:
a MOSFET differential amplifier with a current mirror load; and
a transient-reduction network electrically interconnected with the MOSFET differential amplifier and configured to reduce transient energy emitted by the ADC; and a second unity-gain buffer cascaded to the first unity-gain buffer and configured to provide the analog input signal from the first unity-gain buffer to the ADC, wherein the second unity-gain buffer consumes more power than the first unity-gain buffer.

2. The buffer circuit of claim 1, wherein the second unity-gain buffer comprises a MOSFET differential amplifier with a current mirror load.

3. The buffer circuit of claim 2, wherein the MOSFET differential amplifiers of each unity-gain buffer comprise a variable current source, whereby the variation in the current applied by the current source varies the bandwidth of the amplifiers.

4. The buffer circuit of claim 3, wherein the bandwidth of the amplifiers is controlled to account for changes in the operating characteristics of the circuit.

5. The buffer circuit of claim 3, wherein the variation in the bandwidth of the amplifiers is provided by programming the current source with a predetermined value based upon one of a plurality of xDSL communication applications.

6. The buffer circuit of claim 1, wherein the first unity-gain buffer has a smaller bandwidth than that of the second unity-gain buffer.

7. The buffer circuit of claim 1, wherein the transient-reduction network comprises:

impedance elements coupled to each source of MOSFETS of the differential amplifier and to a common current source, whereby the impedance elements act to isolate the sources of the MOSFETS from each other so as to reduce any transferred transient energy from one MOSFET to another; and a de-coupling capacitor connected in parallel with the common current source and configured to further reduce any transferred transient energy.

8. A buffer circuit for a high-bandwidth analog-to-digital converter (ADC), the buffer circuit comprising:

a first unity-gain buffer configured to receive an analog input signal, the first unity-gain buffer comprising:

a MOSFET differential amplifier with a current mirror load; and a transient-reduction network electrically interconnected with the MOSFET differential amplifier and configured to reduce transient energy emitted by the ADC, wherein the transient-reduction network comprises a de-coupling capacitor connected in parallel with the common current source and configured to further reduce any transferred transient energy; and a second unity-gain buffer cascaded to the first unity-gain buffer and configured to provide the analog input signal from the first unity-gain buffer to the ADC.

9. The buffer circuit of claim 8, wherein the second unity-gain buffer comprises a MOSFET differential amplifier with a current mirror load.

10. The buffer circuit of claim 9, wherein the MOSFET differential amplifiers of each unity-gain buffer comprise a variable current source, whereby the variation in the current applied by the current source varies the bandwidth of the amplifiers.

11. The buffer circuit of claim 10, wherein the bandwidth of the amplifiers is controlled to account for changes in the operating characteristics of the circuit.

12. The buffer circuit of claim 11, wherein the variation in the bandwidth of the amplifiers is provided by programming the current source with a pre-determined value based upon one of a plurality of xDSL communication applications.

13. The buffer circuit of claim 8, wherein the second unity-gain buffer consumes more power than the first unity-gain buffer.

14. The buffer circuit of claim 13, wherein the first unity-gain buffer has a smaller bandwidth than that of the second unity-gain buffer.

15. The buffer circuit of claim 8, wherein the transient-reduction network comprises:

impedance elements coupled to each source of MOSFETS of the differential amplifier and to a common current source, whereby the impedance elements act to isolate the sources of the MOSFETS from each other so as to reduce any transferred transient energy from one MOSFET to another.

* * * * *